(12) United States Patent
Lee et al.

(10) Patent No.: US 9,022,244 B2
(45) Date of Patent: May 5, 2015

(54) STORAGE CONTAINER FOR ANALYTICAL DEVICE

(71) Applicant: Ceragem Medisys Inc., Chungcheongnam-do (KR)

(72) Inventors: Jin Woo Lee, Chungcheongnam-do (KR); Jae Kyu Choi, Chungcheongnam-do (KR)

(73) Assignee: Ceragem Medisys Inc. (KR)

( * ) Notice: Subject to any disclaimer, the term of this patent is extended or adjusted under 35 U.S.C. 154(b) by 0 days.

(21) Appl. No.: 14/361,484

(22) PCT Filed: Nov. 15, 2012

(86) PCT No.: PCT/KR2012/009636
§ 371 (c)(1),
(2) Date: May 29, 2014

(87) PCT Pub. No.: WO2013/081317
PCT Pub. Date: Jun. 6, 2013

(65) Prior Publication Data
US 2014/0374292 A1    Dec. 25, 2014

(30) Foreign Application Priority Data

Dec. 1, 2011 (KR) .................. 10-2011-0127744

(51) Int. Cl.
*B65D 81/26* (2006.01)
*B65D 85/38* (2006.01)
*H05K 5/00* (2006.01)

(52) U.S. Cl.
CPC .............. *B65D 85/38* (2013.01); *H05K 5/0013* (2013.01); *H05K 5/0004* (2013.01)

(58) Field of Classification Search
CPC .......................... H05K 5/0013; H05K 5/0004
USPC ............... 220/507, 676, 592.26, 592.2, 4.02; 206/305
See application file for complete search history.

(56) References Cited

U.S. PATENT DOCUMENTS

| | | | | |
|---|---|---|---|---|
| 5,036,432 | A * | 7/1991 | Uronen et al. | 361/814 |
| 2003/0026082 | A1* | 2/2003 | Gustine et al. | 361/801 |
| 2008/0164164 | A1* | 7/2008 | Zhong | 206/305 |
| 2011/0040165 | A1* | 2/2011 | Williams, III | 600/365 |

(Continued)

FOREIGN PATENT DOCUMENTS

| | | |
|---|---|---|
| JP | 07-244047 | 9/1995 |
| JP | 2001-072148 | 3/2001 |

(Continued)

*Primary Examiner* — Steven A. Reynolds
*Assistant Examiner* — King M Chu
(74) *Attorney, Agent, or Firm* — Riverside Law LLP

(57) ABSTRACT

The present invention discloses a storage container for an analytical device, capable of easily storing and using a sensor, The storage container for an analytical device in which a sensor is stored is configured such that the storage container has a cylindrical shape, the storage container has sensor storage portions therein radially arranged about a center point so that sensors can be inserted into the sensor storage portions, the storage container has an opening formed at a top surface of one side thereof and communicated to the sensor storage portions, and the storage container has a circumferential surface in which cut portions arc formed to be communicated with the sensor storage portions and cut to he extended from the end of the other side of the storage container to the opening along a lengthwise direction, thus allowing for ease of storage and use of sensors.

8 Claims, 5 Drawing Sheets

(56) References Cited

U.S. PATENT DOCUMENTS

2011/0147244 A1* 6/2011 Chan et al. .................. 206/305
2013/0168403 A1* 7/2013 Brown et al. ................. 221/31
2013/0284624 A1* 10/2013 Leichner ...................... 206/305
2014/0367286 A1* 12/2014 Chen ............................ 206/305
2014/0374292 A1* 12/2014 Lee et al. ..................... 206/305

FOREIGN PATENT DOCUMENTS

| JP | 2002-193352 | 7/2002 |
| JP | 2004-003958 | 1/2004 |
| WO | WO 92/17389 | 10/1992 |
| WO | WO 2008/092639 | 8/2008 |

* cited by examiner

STORAGE CONTAINER FOR ANALYTICAL DEVICE

CROSS-REFERENCE TO RELATED APPLICATIONS

This application is the U.S. national phase application filed under 35 U.S.C. §371 claiming benefit to International Patent Application No. PCT/KR2012/009636, filed on Nov. 15, 2012, which is entitled to priority under 35 U.S.C. §119(a)-(d) to Korea application no. 10-2011-0127744, filed Dec. 1, 2011, each of which application is hereby incorporated herein by reference in its entirety.

TECHNICAL FIELD

The present invention relates to a storage container for an analytical device, which may include a number of chambers on which a number of sensors can be seated provided therein, and protect a sensor which is wrapped with a packing paper to be stored in the storage container and simultaneously allow the stored sensor to be drawn out one by one.

BACKGROUND ART

In laboratories, researches on a sensor and a storage container for the sensor which can be used for chemical or biochemical analysis of solid and liquid sample materials, for example, used in a portable analytical device are conducted.

Even though reactions associated with sensitive reagents are complicated, a sensor based on dry chemistry, which is specifically developed, is not complicated and therefore can be used by non-experts. As the most prominent example of such a sensor, a sensor that measures blood sugar levels of diabetic patients is used. Other than this, various types of sensors for analysis are used. In the present invention, a sensor that is used to measure the blood will be described as an example.

A dry chemical sensor storage container is usually packed several times for sales to users. The sensor is packed by a first packing material that directly wraps the sensor and an additional packing material (external packing material). First packing is performed for the purpose of meeting essential features for maintaining functions of chemical and biochemical components on test elements during a prolonged storage period. Such an essential feature means protecting the test elements from the influence of sunlight, atmospheric humidity, filth, the intrusion of microorganism and dust, and mechanical damage.

In general, the conventional sensor packing papers are sold in a state of being individually packed, and when a user wants to start blood analysis, a process in which a packing paper of any one of the individually packed sensors is torn, the sensor whose packing paper is torn is drawn into the analytical device, and then blood is inserted into the analytical device is performed.

The sensors having such a conventional structure are individually packed to cause difficulties in their storage, and should be manually drawn into the analytical device one by one by a user. In addition, in a process in which a user draws the sensor into the analytical device while holding the sensor with his or her hand, there are problems such that the user is likely to contaminate the sensor or cannot draw the sensor into an appropriate position to cause inaccurate result values.

DISCLOSURE

Technical Problem to be Solved

The present invention is directed to providing a storage container for an analytical device which may simultaneously store a number of sensors.

In addition, the present invention is directed to providing a storage container for an analytical device which may have a structure easy to sequentially drawing sensors from the storage container.

In addition, the present invention is directed to providing a storage container for an analytical device which may have a structure in which the storage container is mounted in an automated measurement device so that sensors are automatically drawn out.

Technical Solution

One aspect of the present invention provides a storage container for an analytical device in which sensors are stored, wherein: the storage container has a cylindrical shape; sensor storage portions therein are radially arranged with respect to a center point, and opening portions are formed at a top surface of one side of the storage container, each of the opening portions communicating with each of the sensor storage portions ; and cut portions are formed on a circumferential surface of the storage container, each of the cut portions communicating with each of the sensor storage portions and being cut to extend from an end of the other side of the storage container to each of the opening portions in a longitudinal direction.

In addition, more preferably, the top surface and the circumferential surface of the storage container may be sealed by a packing material for covering the opening portions and the cut portions.

In addition, more preferably, a bottom surface provided at an end of the other side of each of the sensor storage portions may include an inclined surface inclined toward the respective opening portion.

In addition, more preferably, a moisture-proof material provided to communicate with the sensor storage portions may be further included in the storage container.

In addition, more preferably, at least one identification means for identifying characteristics of the sensor may be further included in the storage container.

In addition, more preferably, a recessed insertion groove to which a rotary shaft of the analytical device is inserted may be provided in a central axis of the storage container, and a plurality of gear protrusions may be provided on an inner circumferential surface of the insertion groove.

In addition, more preferably, a rotation sensor for detecting a rotational position of the storage container may be attached to a bottom surface of the other side of the storage container.

In addition, more preferably, the packing material may be made of a thin film material of a component which blocks light and moisture and does not affect characteristics of the sensor.

In addition, more preferably, the sensor may be moved toward the opening portion by a pressure piece which cuts the packing material positioned in the cut portion and is drawn in along the bottom surface to be moved in the longitudinal direction of the storage container, and cut the packing material in a position of the opening portion to be drawn out to the outside.

In addition, more preferably, the packing material may further include a moisture-proof component or a moisture-proof element.

Advantageous Effects

According to the storage container for the analytical device according to the present invention, it is possible to store a number of sensors by the bundle in the storage container, and prevent damages due to shake or collision, falling, and the like. In addition, it is possible to improve airtightness, and prevent damages to a packing paper due to light collision or friction with the periphery.

In addition, a pressure piece may be inserted into a slot formed along the circumferential surface of the storage container so that sensors seated inside the storage container can be sequentially drawn out one by one, thereby improving usability.

BEST MODE

Hereinafter, examples of an embodiment of the present invention will be described in more detail with reference to the accompanying drawings.

Figure 1:
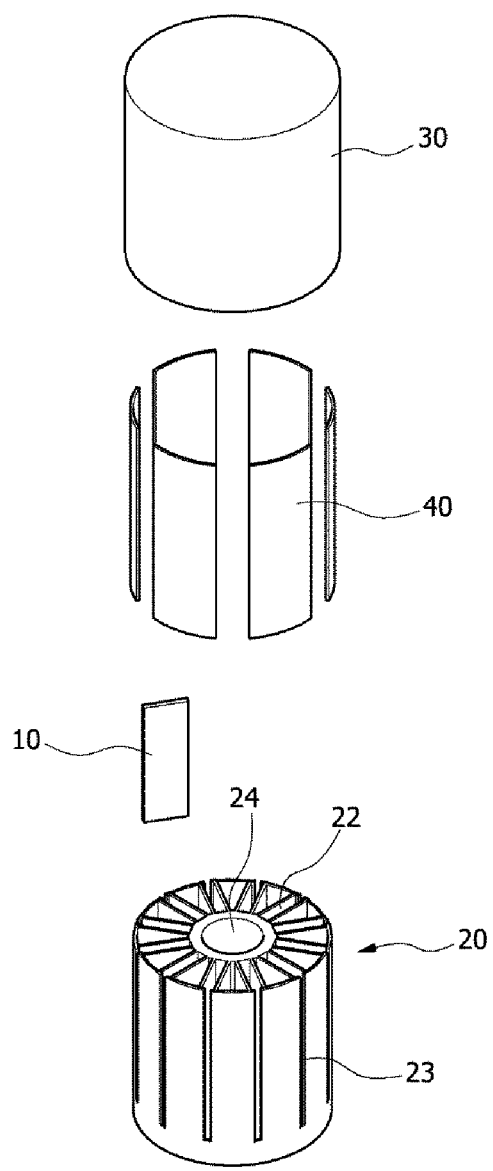
FIG. 1 is an exploded perspective diagram illustrating a storage container according to an embodiment of the present invention.
Figure 2:
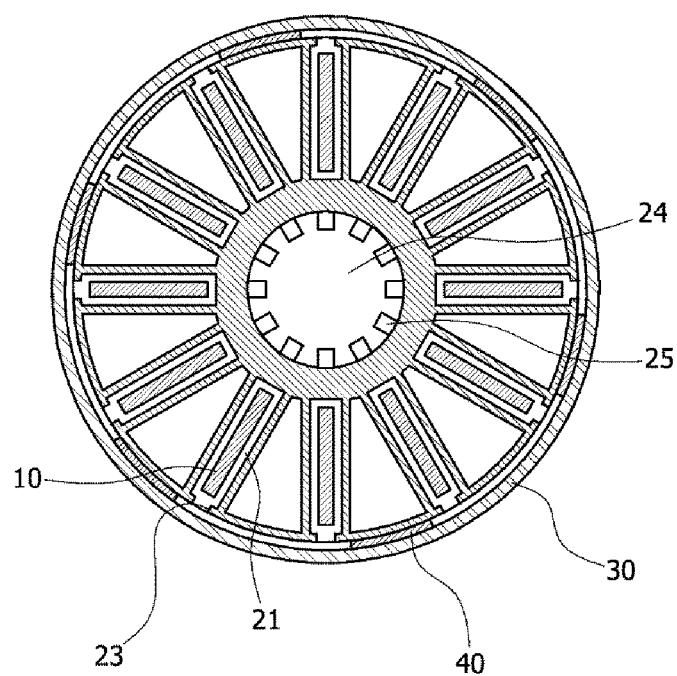
FIG. 2 is a plan diagram illustrating the storage container of FIG. 1.
Figure 3:
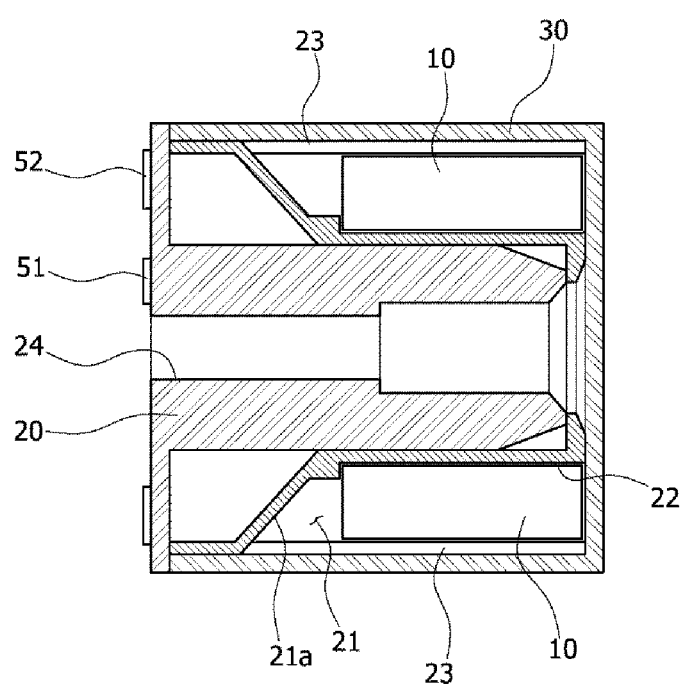
FIG. 3 is a cross-sectional diagram illustrating the storage container of FIG. 1.
Figure 4:
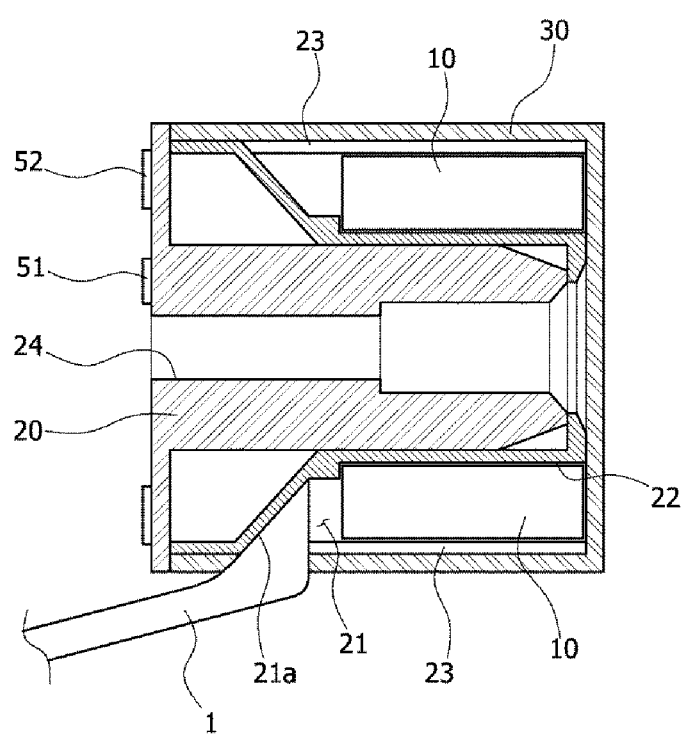
FIG. 4 is a state diagram illustrating a state in which a pressure piece is inserted into a storage container.
Figure 5:
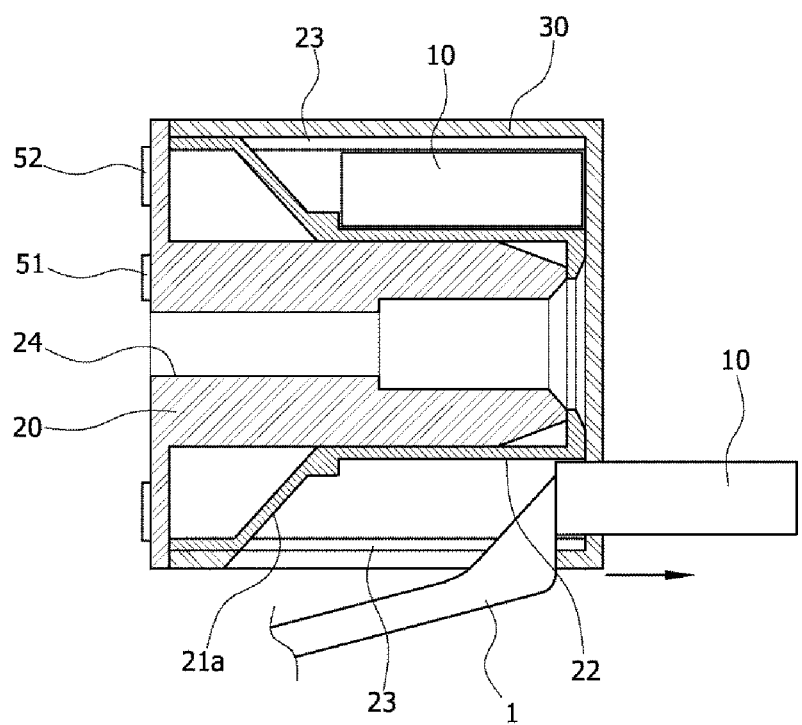
FIG. 5 is a state diagram illustrating a state in which a pressure piece draws out a sensor.

FIG. 1 is an exploded perspective diagram illustrating a storage container according to an embodiment of the present invention, FIG. 2 is a plan diagram illustrating the storage container of FIG. 1, FIG. 3 is a cross-sectional diagram illustrating the storage container of FIG. 1, FIG. 4 is a state diagram illustrating a state in which a pressure piece is inserted into a storage container, and FIG. 5 is a state diagram illustrating a state in which a pressure piece draws out a sensor.

As illustrated in FIGS. 1 to 5, a storage container 20 for an analytical device according to an embodiment of the present invention has a cylindrical shape, and a packing material 30 is wrapped around an outer circumferential surface of the storage container 20.

The storage container 20 includes a number of sensor storage portions 21 so that sensors 10 can be inserted into the sensor storage portions 21. The sensor storage portions 21 are radially arranged with respect to a center point of the storage container 20. At a top surface of one side of the storage container 20, opening portions 22 that allow the sensor storage portions 21 to communicate with the outside are formed.

On a circumferential surface of the storage container 20, cut portions 23 which are cut to extend from an end of the other side of the storage container 20 to the opening portion 22 are formed so that each of the cut portions 23 can communicate with each of the sensor storage portions 21. The cut portions 23 have a gap for allowing a pressure piece 1 to be inserted therein. Preferably, the cut portions 23 extend horizontally with a central axis in a longitudinal direction.

The sensor storage portions 21 have an inner space for allowing the sensors 10 to be inserted therein. Preferably, a bottom surface 21a provided at an end of the other side of the sensor storage portions 21 is constituted of an inclined surface.

Preferably, the sensors 10 are supplies for an analytical device such as an electric formula strip, an optical strip, an immune diagnostic strip, or the like, or supplies for analysis, and preferably used as a disposable. The sensors 10 may include a sample introduction unit and a reaction unit, and further include a reaction transmission unit that transmits a reaction or a reaction display unit that displays the reaction. As an example, in a case of the electrical formula strip, the sensors 10 may include a capillary tube for sample introduction, an electrode unit in which a reaction reagent is immobilized, and a signal transmission unit that transmits reaction signals.

Preferably, the packing material 30 is made of a thin film material of a component which blocks light and moisture and does not affect characteristics of the sensors 10. The packing material 30 has a cup shape and is attached to the top surface and the circumferential surface of the storage container 20. The packing material 30 covers the opening portion 22 of each of the sensor storage portions 21 and the cut portions 23 so that the sensor storage portions 21 are kept sealed. A moisture-proof material 40 may be inserted between the packing material 30 and the circumferential surface of the storage container 20. Alternatively, the moisture-proof material 40 may be stored in each of separate storage spaces formed in the sensor storage portions 21 of the storage container 20. Alternatively, the moisture-proof material 40 may be stored in a space formed on a rear side of the bottom surface 21a within each of the sensor storage portions 21. The space in which each moisture-proof material 40 is stored preferably communicates with each of the sensor storage portions 21. Alternatively, the packing material 30 may be made of a component serving as the moisture-proof material 40, or a component including a moisture-proof element such as a moisture-proof film. That is, since the packing material 30 itself performs a moisture-proof function, the separate moisture-proof material 40 may not be used.

An insertion groove 24 is formed in the central axis of the storage container 20. The insertion groove 24 is a groove to which a rotary shaft formed in a measurement device is inserted, and a number of gear protrusions 25 are preferably formed on an inner circumferential surface of the insertion groove 24. The storage container 20 may further include an identification means 51 capable of identifying characteristics of the sensors such as types or correction codes of the stored sensors 10. As shown in FIG. 5, the identification means 51 is preferably mounted on the bottom surface of the other side of the storage container 20, but the present invention is not limited thereto. The identification means 51 may be at least one of an electrode, a barcode, a QR code, a three-dimensional shapes (or array or combination of shapes), a code key, a color displaying means, an active/passive RF chip, a memory, and an identification means having a level equivalent to these. On the bottom surface of the storage container 20, a rotation sensor 52 for detecting a rotational position of the storage container 20 may be provided. The rotation sensor 52 is arranged to form a circular arc so that the measurement device can detect and control a rotation angle of the storage container 20 while the rotation sensor 52 is brought into contact with an electrode provided in the measurement device.

In a state in which a number of sensors 10 are stored in the storage container 20 configured as above, each of the sensor storage portions 21 is kept sealed by the packing material 30, and therefore the storage container 20 may be easily handled and damages to sensors 10 due to moisture or dust may be prevented. In addition, when the sensors 10 are desired to be used, one of the number of sensors 10 stored in each of the sensor storage portions 21 may be taken out to be used, and therefore the sensors 10 can be easily stored.

A process of drawing out the sensors 10 will be herein described in more detail with reference to FIGS. 4 and 5. As shown in FIGS. 4 and 5, the packing material 30 is cut using a pointed part of the pressure piece 1, and then the pressure piece 1 is inserted into the cut portions 23. When the pressure piece 1 is completely drawn into the sensor storage portions 21 while being slidably moved along the bottom surface 21a, the pressure piece 1 is moved in the longitudinal direction of the storage container 20. In this instance, the pressure piece 1 presses one side surface of the sensors 10 to move the sensors 10 towards the opening portion 22, and the opening portion side of the packing material 30 is cut by the other side surface of the moved sensors 10. A top surface side of the packing material 30 is pushed by the pressure piece 1 while being cut, so that the sensors 10 are drawn out to the outside.

As described above, in the storage container 20 for the analytical device according to the present invention, the packing material 30 may be cut using the pointed part of the pressure piece 1, whereby the packing material 30 may be cut without excessive force. In addition, a pressed surface which is pressed in such a manner that the pressure piece 1 is brought into contact with the sensors 10 is made thicker than the sensor 10 and made flat, and therefore it is possible to prevent the pressure piece 1 from being inserted between the sensors 10 and an inner side wall of the sensor storage portions 21 while pressing the sensors 10. Since the cut portions 23 are formed in the circumferential surface of the storage container 20, a direction of a force which is applied for the pressure piece 1 to cut the packing material 30 and a direction in which the pressure piece 1 presses the sensors 10 are different from each other, and therefore it is possible to prevent damages to the sensors 10 while transporting the sensors 10 even though a distal end of the pressure piece 1 which is brought into contact with the packing material 30 is pointed.

Although the example embodiments of the present invention have been described in detail, it should be understood by those skilled in the art that various changes, substitutions, and alterations may be made herein without departing from the scope of the invention.

Therefore, it would be understood that the scope and spirit of the present invention is not limited to these embodiments, and that the scope of the present invention should be interpreted without departing from the principles and spirit of the invention, the scope of which is defined in the claims and their equivalents.

The invention claimed is:

1. A storage container for an analytical device in which sensors (10) are stored, wherein:
    the storage container (20) has a cylindrical shape;
    sensor storage portions (21) therein are radially arranged with respect to a center point, and opening portions (22) are formed at a top surface of one side of the storage container (20), each of the opening portions (22) communicating with each of the sensor storage portions (21);
    cut portions (23) are formed on a circumferential surface of the storage container (20), each of the cut portions (23) communicating with each of the sensor storage portions (21) and being cut to extend from an end of the other side of the storage container (20) to each of the opening portions (22) in a longitudinal direction;
    the top surface and the circumferential surface of the storage container (20) are sealed by a packing material (30) for covering the opening portions (22) and the cut portions (23); and
    the sensor (10) is moved toward the opening portion (22) by a pressure piece (1) which cuts the packing material (30) positioned in the cut portion (23) and is drawn in along the bottom surface to be moved in the longitudinal direction of the storage container (20), and cuts the packing material (30) in a position of the opening portion (22) to be drawn out to the outside.

2. The storage container for the analytical device according to claim 1, wherein:
    a bottom surface (21a) provided at an end of the other side of each of the sensor storage portions (21) includes an inclined surface inclined toward the respective opening portion (22).

3. The storage container for the analytical device according to claim 1, wherein:
    a moisture-proof material (40) provided to communicate with the sensor storage portions (21) is further included in the storage container (20).

4. The storage container for the analytical device according to claim 1, wherein:
    at least one identification means (51) for identifying characteristics of the sensor (10) is further included in the storage container (20).

5. The storage container for the analytical device according to claim 1, wherein:
    a recessed insertion groove (24) to which a rotary shaft of the analytical device is inserted is provided in a central axis of the storage container (20), and a plurality of gear protrusions (25) are provided on an inner circumferential surface of the insertion groove (24).

6. The storage container for the analytical device according to claim 1, wherein:
    a rotation sensor (52) for detecting a rotational position of the storage container (20) is attached to a bottom surface of the other side of the storage container (20).

7. The storage container for the analytical device according to claim 1, wherein:
    the packing material (30) is made of a thin film material of a component which blocks light and moisture and does not affect characteristics of the sensor (10).

8. The storage container for the analytical device according to claim 7, wherein:
    the packing material (30) further includes a moisture-proof component or a moisture-proof element.

* * * * *